United States Patent
Mihara et al.

(10) Patent No.: US 9,681,547 B2
(45) Date of Patent: Jun. 13, 2017

(54) ELECTRONIC DEVICE

(71) Applicant: FUJITSU LIMITED, Kawasaki-shi, Kanagawa (JP)

(72) Inventors: Daisuke Mihara, Kawasaki (JP); Hirohisa Nakabayashi, Takarazuka (JP); Ikki Tatsukami, Tama (JP)

(73) Assignee: FUJITSU LIMITED, Kawasaki (JP)

( * ) Notice: Subject to any disclaimer, the term of this patent is extended or adjusted under 35 U.S.C. 154(b) by 839 days.

(21) Appl. No.: 13/847,719

(22) Filed: Mar. 20, 2013

(65) Prior Publication Data

US 2013/0279133 A1   Oct. 24, 2013

(30) Foreign Application Priority Data

Apr. 23, 2012   (JP) ................. 2012-098234

(51) Int. Cl.
| | |
|---|---|
| *G06F 1/18* | (2006.01) |
| *H05K 1/11* | (2006.01) |
| *H05K 7/10* | (2006.01) |
| *G06F 1/16* | (2006.01) |

(52) U.S. Cl.
CPC ........... *H05K 1/117* (2013.01); *G06F 1/1658* (2013.01); *H05K 7/10* (2013.01)

(58) Field of Classification Search
CPC ......... G06F 1/1658; H05K 1/117; H05K 7/10
USPC ..................................... 361/679.01
See application file for complete search history.

(56) References Cited

U.S. PATENT DOCUMENTS

| | | | |
|---|---|---|---|
| 2009/0168316 A1* | 7/2009 | Goto ................. | G06F 1/1616 361/679.08 |
| 2013/0107137 A1* | 5/2013 | Nonomura et al. ......... | 348/836 |

FOREIGN PATENT DOCUMENTS

| | | | | |
|---|---|---|---|---|
| JP | 62-177087 | * | 10/1987 | ............. H05K 1/117 |
| JP | 62-177087 U | | 11/1987 | |
| JP | 2011-118766 A | | 6/2011 | |

OTHER PUBLICATIONS

Office Action dated Dec. 8, 2015, issued in counterpart Japanese Application No. 2012-098234, w/ partial English translation. (8 pages).

* cited by examiner

*Primary Examiner* — Jenny L Wagner
*Assistant Examiner* — Michael E Moats, Jr.
(74) *Attorney, Agent, or Firm* — Westerman, Hattori, Daniels & Adrian, LLP

(57) ABSTRACT

An electronic device includes: a housing including an opening; a connector configured to be exposed from the opening and to allow a connection member to be coupled thereto; and a cable configured to cover at least a portion of a gap between the connector and the opening and to be electrically coupled to the connector.

12 Claims, 7 Drawing Sheets

ELECTRONIC DEVICE

CROSS-REFERENCE TO RELATED APPLICATION(S)

This application is based upon and claims the benefit of priority of the prior Japanese Patent Application No. 2012-098234, filed on Apr. 23, 2012, the entire contents of which are incorporated herein by reference.

FIELD

The embodiments discussed herein are related to a display device.

BACKGROUND

An electronic device includes a connector.

Such a connector may be provided so as to be exposed from an opening formed in a housing of an electronic device. If a gap is present between the connector and the opening, there is the possibility that a connection member is erroneously inserted into the gap when the connection member is connected to the connector.

The related art is disclosed in Japanese Laid-open Patent Publication No. 2011-118766.

SUMMARY

According to one aspect of the embodiments, an electronic device includes: a housing including an opening; a connector configured to be exposed from the opening and to allow a connection member to be coupled thereto; and a cable configured to cover at least a portion of a gap between the connector and the opening and to be electrically coupled to the connector.

The objects and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
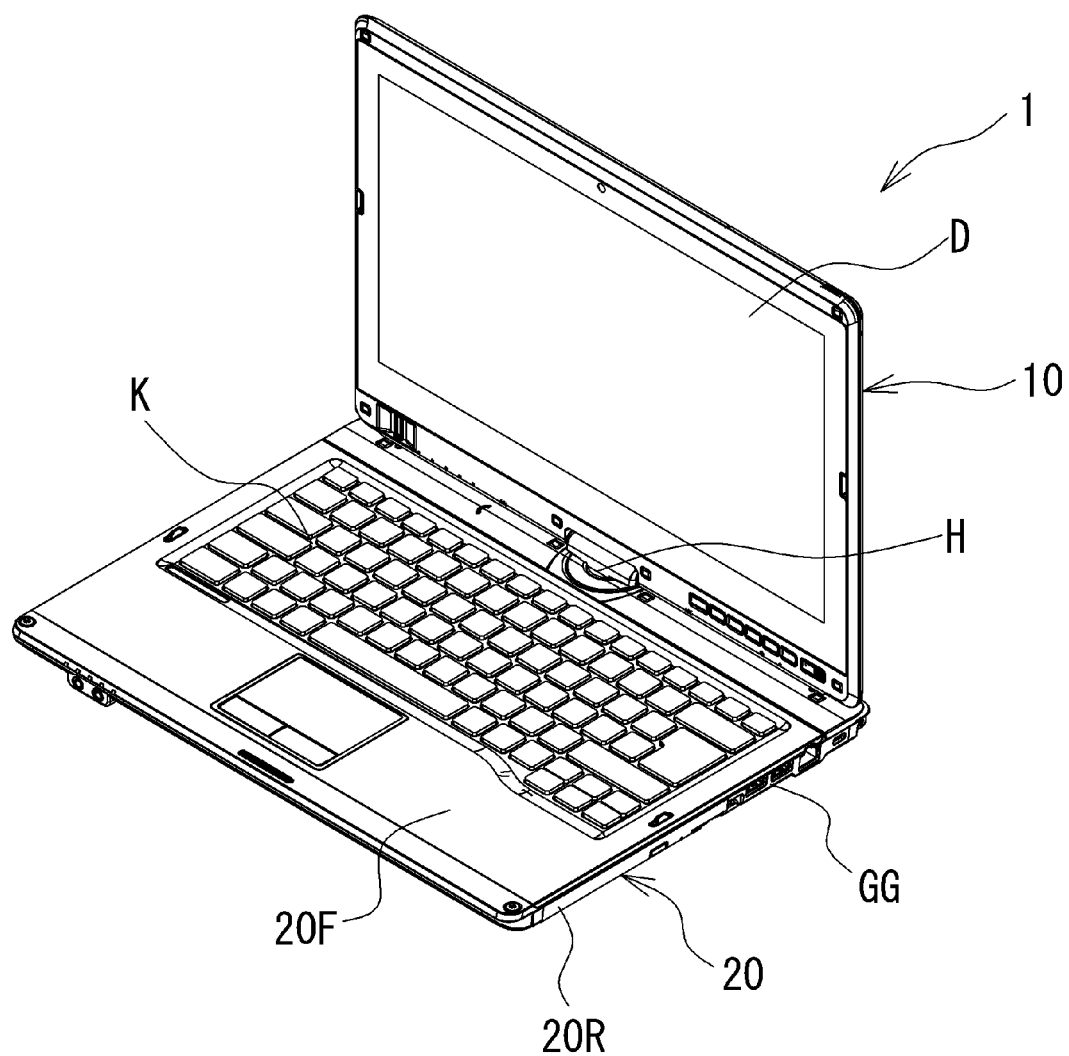
FIG. 1 illustrates an exemplary electronic device.

FIG. 1 illustrates an exemplary electronic device. The electronic device illustrated in FIG. 1 may be a notebook computer. The notebook computer 1 includes housings 10 and 20. The housings 10 and 20 are coupled to each other via a two-axis hinge H such that these housings are able to be opened and closed and are able to rotate. The housing 10 includes a display D which displays an image. The display D has a touch panel function. The housing 20 includes a front casing (hereinafter, referred to as casing) 20F and a rear casing (hereinafter, referred to as casing) 20R. The casing 20F includes a keyboard K for operating the notebook computer 1. The casing 20R includes a connector group CG for coupling an external device.

Figure 2:
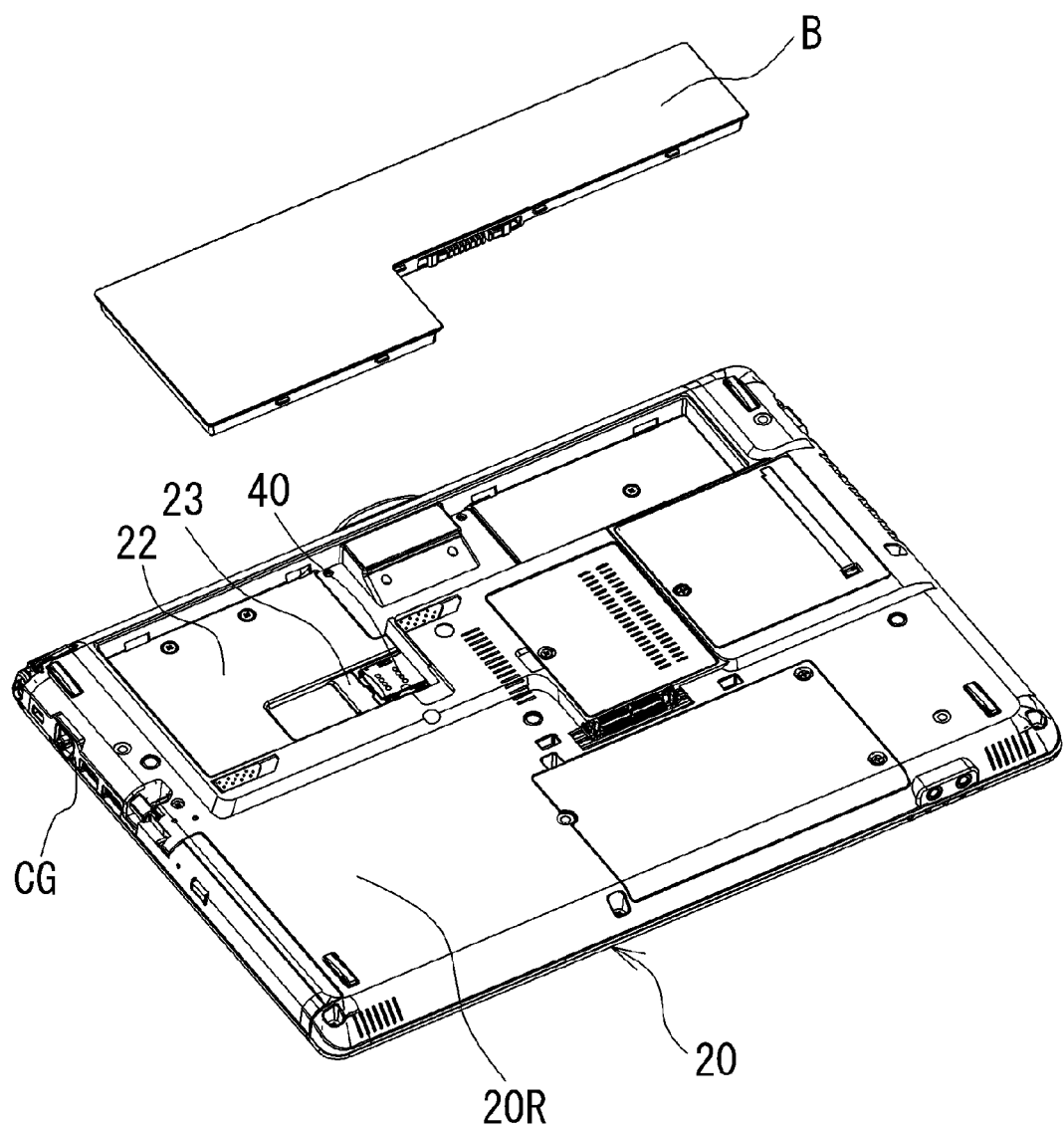
FIG. 2 illustrates an exemplary housing.

FIG. 2 illustrates an exemplary housing. In FIG. 2, a view of the housing 20 seen from the casing 20R side is illustrated. An attachable/detachable battery B is provided on the casing 20R side of the housing 20. The battery B is mounted in a recess 22 of the casing 20R. When the battery B is removed from the casing 20R, a connector 40 is exposed. For example, the connector 40 is exposed through an opening provided in the casing 20R. A periphery portion 23 which is an opening periphery defining the opening is formed. The periphery portion 23 is located on a near side of the connection opening for the connector 40.

Figure 3:
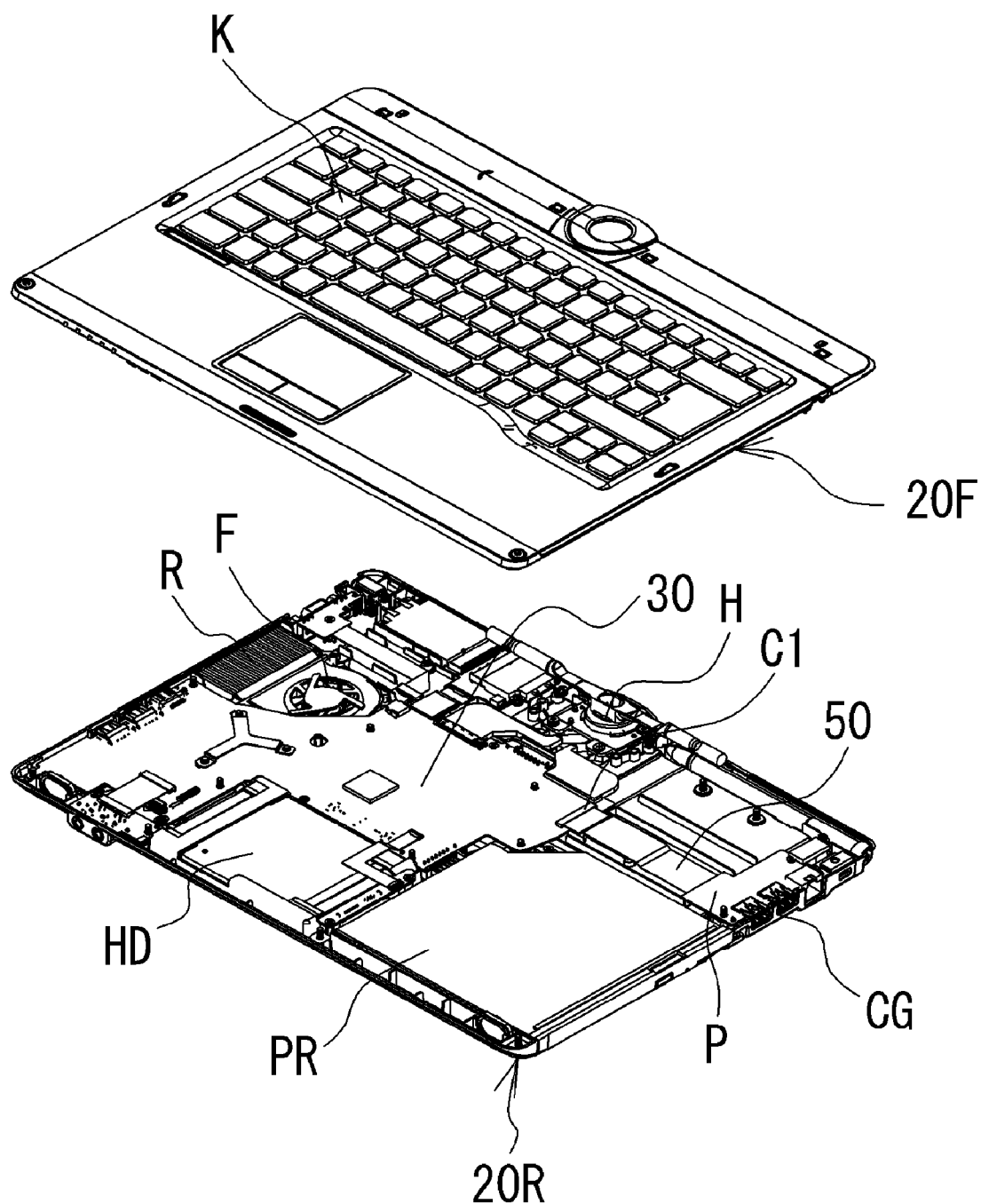
FIG. 3 illustrates an exemplary exploded perspective view of a housing.

FIG. 3 illustrates an exemplary exploded perspective view of a housing. In FIG. 3, an exploded perspective view of the housing 20 seen from the casing 20F side is illustrated. Within the housing 20, a mother board 30 on which a semiconductor chip and the like are mounted, a radiator R or a fan F for dissipating heat of the semiconductor chip, a hard disk HD, and a player PR which is capable of playing a recording medium are arranged. Within the housing 20, P on which the connector group CG is mounted is arranged. An end of a flat cable 50 is coupled to a cable connector (hereinafter, referred to as connector) C1 provided on the mother board 30 and thus the flat cable 50 is electrically coupled to the mother board 30. In the flat cable 50, a plurality of cables are joined to each other.

Figure 4:
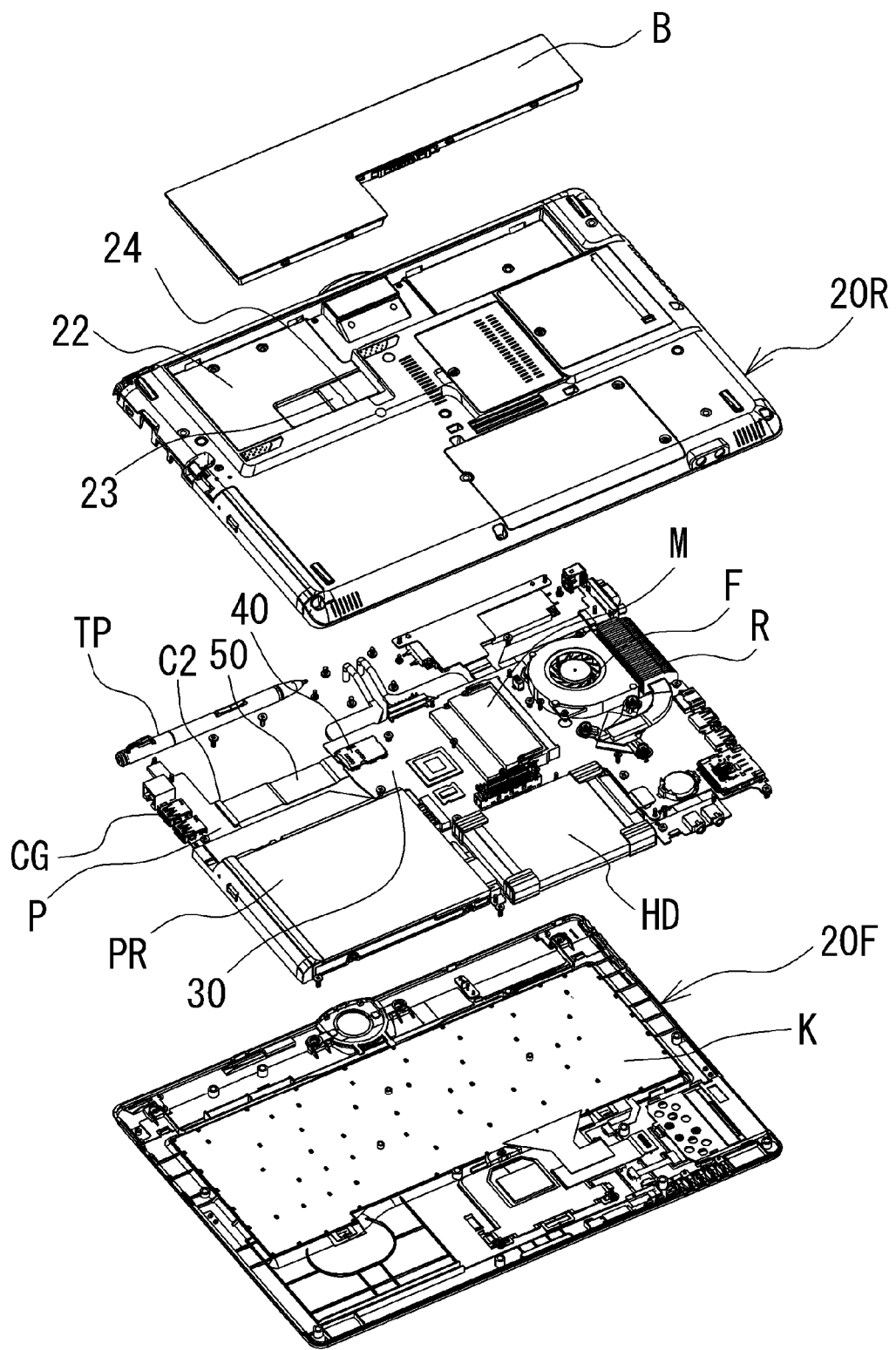
FIG. 4 illustrates an exemplary exploded perspective view of a housing.

FIG. 4 illustrates an exemplary exploded perspective view of a housing. In FIG. 4, an exploded perspective view of the housing 20 seen from the casing 20R side is illustrated. In the recess 22, an opening 24 is formed for exposing the connector 40. The connector 40 is mounted on the mother board 30. The other end of the flat cable 50 is coupled to a cable connector (hereinafter, referred to as connector) C2 provided on the P and thus the flat cable 50 is electrically coupled to the P. Therefore, the mother board 30 and the P are electrically coupled to each other via the flat cable 50. A touch pen TP for operating a touch panel of the display D is stored on a base side of the housing 20. A memory M is mounted on the mother board 30.

Figure 5:
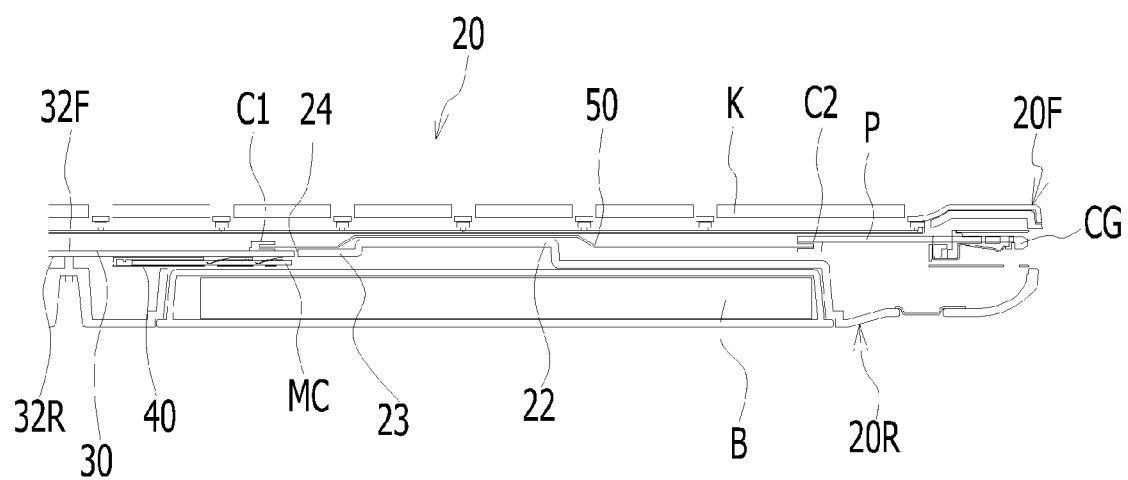
FIG. 5 illustrates an exemplary cross-sectional view of a housing.

FIG. 5 illustrates an exemplary cross-sectional view of a housing. In FIG. 5, a cross-sectional view of the housing 20 is illustrated. The mother board 30 includes a surface 32F facing the casing 20F and a surface 32R facing the casing 20R. The connector C1 is mounted on the surface 32F side, and the connector 40 is mounted on the surface 32R side. The memory card MC is coupled to the connector 40. The memory card MC may be a card-shaped recording medium. The memory card MC may be attachable to and detachable from the connector 40.

Figure 6:
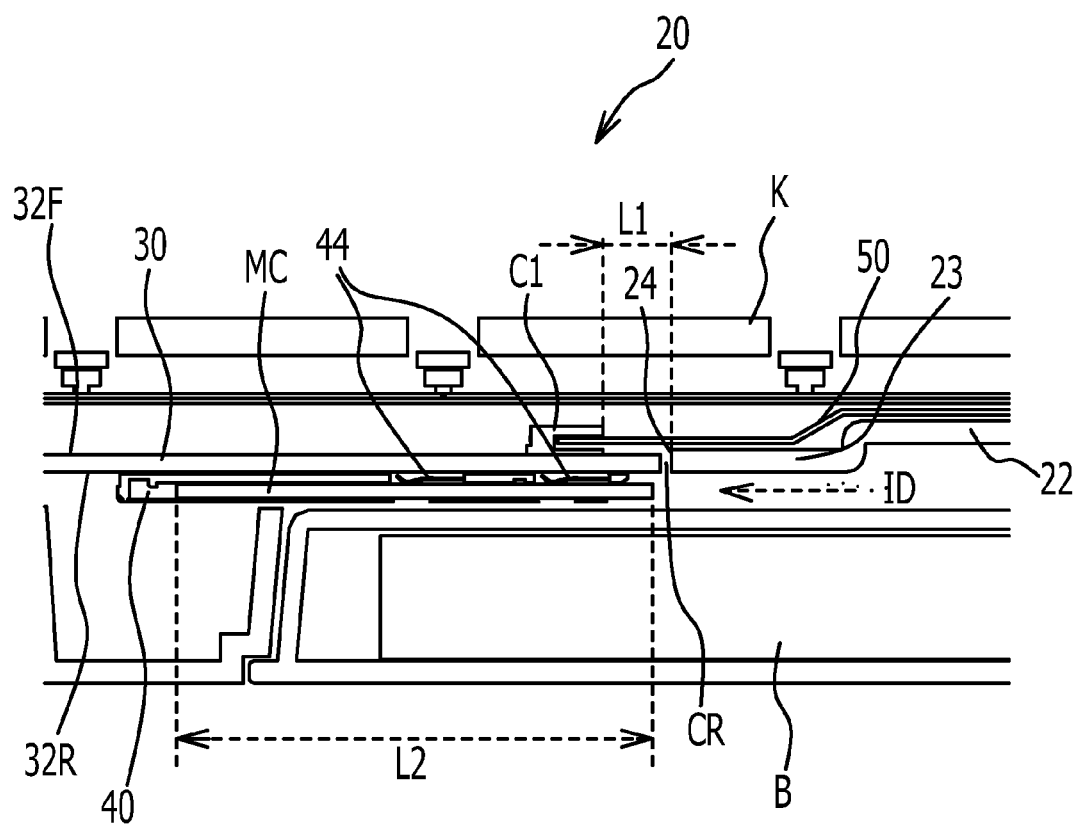
FIG. 6 illustrates an exemplary enlarged view of a housing.

FIG. 6 illustrates an exemplary enlarged view of a housing. FIG. 6 may be an enlarged view of FIG. 5. Within the connector 40, a contact portion 44 electrically coupled to the memory card MC is formed. As illustrated in FIG. 6, a gap CR is formed between the connector 40 and the opening 24, for example, between the opening 24 and the mother board 30 on which the connector 40 is mounted. The opening 24 may be formed so as to be large in size based on dimensional tolerance or variation of formation accuracy of each member for reducing contact with the connector 40 or the mother board 30. Thus, the gap CR may be formed. The flat cable 50 extends so as to cover the gap CR.

Figure 7A:
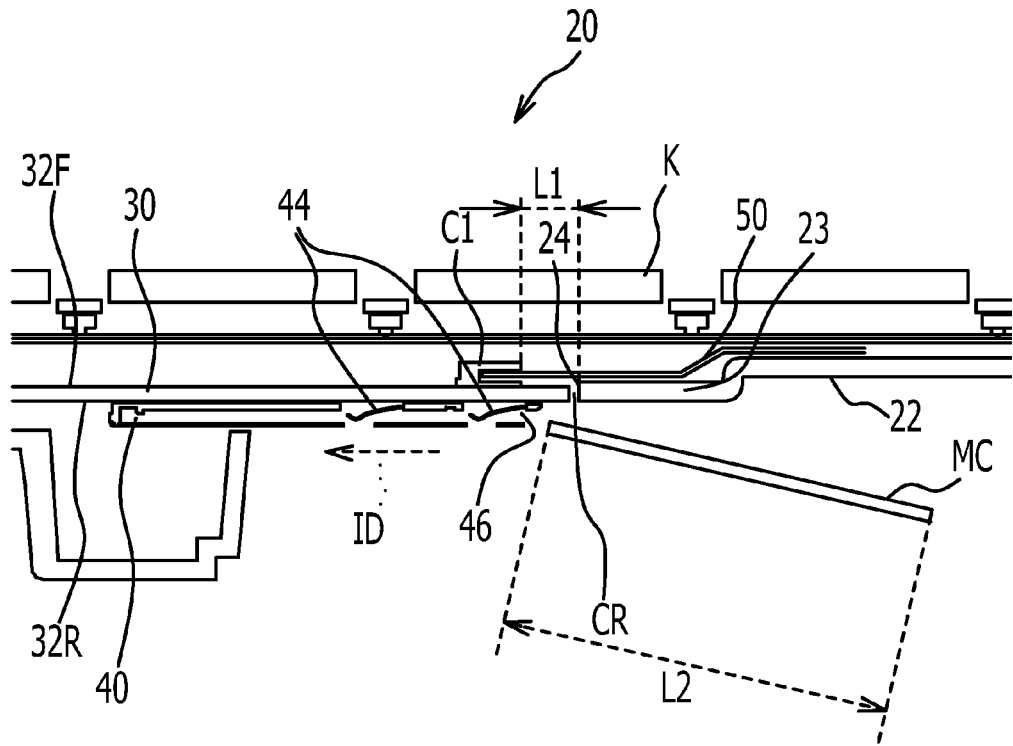
FIGS. 7A and 7B illustrate an exemplary connection process.
Figure 7B:
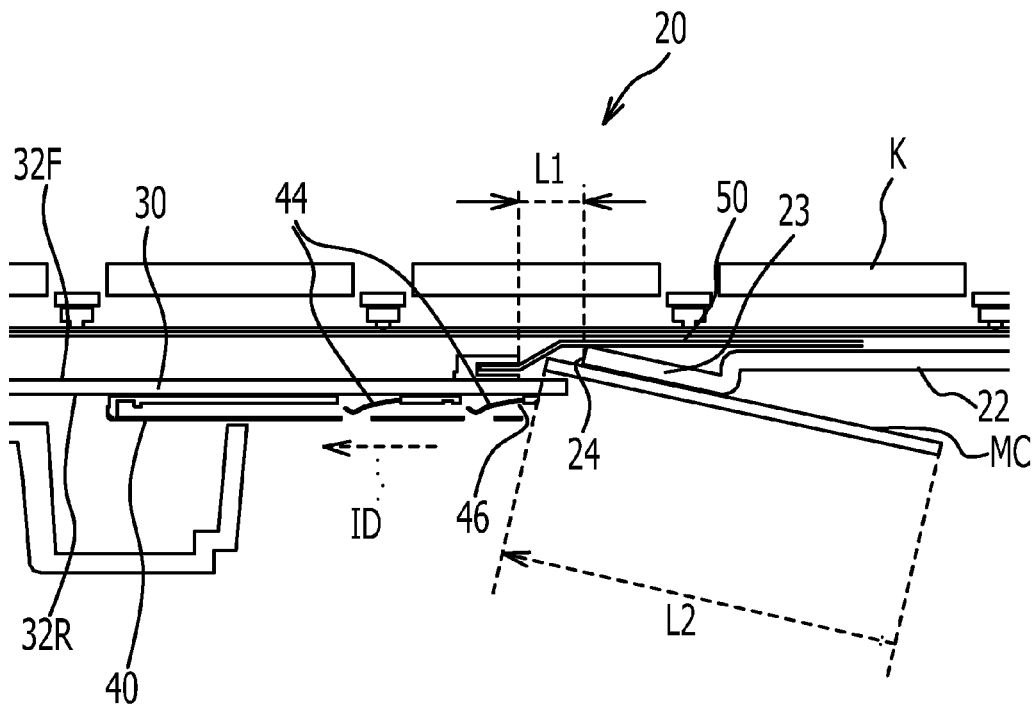

FIGS. 7A and 7B illustrate an exemplary connection process. In FIGS. 7A and 7B, the memory card MC may be coupled to the connector 40. For example, a user removes the battery from the housing 20 to expose the connector 40. The connector 40 includes a connection opening 46 through which the memory card MC is inserted when the memory card MC is coupled thereto. As illustrated in FIG. 7A, the user inserts the memory card MC into the connector 40 through the connection opening 46. The memory card MC is coupled to the connector 40.

The gap CR may be located on the near side of the connection opening 46 in a connection direction ID of the memory card MC. Thus, when the memory card MC is coupled to the connector 40, the user may erroneously insert the memory card MC into the gap CR. For example, when the periphery portion 23 is pressed by the memory card MC, since the casing 20R is made of a synthetic resin and the periphery portion 23 is thin, the periphery portion 23 may elastically deform and the gap CR may expand. For example, as illustrated in FIG. 7B, the insertion of the memory card MC into the gap CR is promoted. When the memory card MC is inserted into the housing 20 through the gap CR, it may be difficult to remove the memory card MC from inside of the housing 20. When the memory card MC is deeply inserted through the gap CR, a peripheral member or the memory card MC may be damaged. Since the flat cable 50 covers the gap CR, when the memory card MC is inserted into the gap CR, the continued insertion of the memory card MC is interfered by the flat cable 50. Thus, deep insertion of the memory card MC into the housing 20 through the gap CR may be reduced. The workability for coupling the memory card MC to the connector 40 may be improved. The connection direction ID may be a direction in which the memory card MC is moved for coupling the memory card MC to the connector 40.

The length L1 from the connector C1 to the gap CR may be shorter than the overall length L2 of the memory card MC in the connection direction ID in which the memory card MC is coupled to the connector 40. Since the connector C1 is provided at such a position, when the memory card MC is erroneously inserted into the gap CR, the flat cable 50 interferes with the memory card MC before the entirety of the memory card MC is inserted into the housing 20 through the gap CR. Thus, insertion of the entirety of the memory card MC into the housing 20 through the gap CR may be reduced.

The flat cable 50 projects from the connector C1 in parallel to the mother board 30. Thus, as compared to the case where the flat cable 50 projects from the connector C1 perpendicularly to the mother board 30, the possibility may be reduced that the flat cable 50 bends and the memory card MC is inserted deeply into the gap CR. The entire thickness of the housing 20 may be decreased. The direction in which the flat cable 50 projects from the connector C1 may be arbitrary.

The flat cable 50 having flexibility may reduce erroneous insertion of the memory card MC into the gap CR. Thus, damage of the memory card MC is reduced.

The cable may be a flat cable, a single cable, or a flexible printed cable. The cable may cover at least a portion of the gap CR. When the portion of the gap CR is covered with the cable, the cable interferes with the insertion of the memory card MC into the gap CR. When the cable is a single cable, the thickness of the cable may be smaller than the size of the gap.

A connection member connectable to the connector may be a storage medium such as a memory card. For example, the connection member may be a connector provided at an end of a cable that couples another device to the electronic device. When the connector provided at the end of the cable is mistakenly inserted into the gap, there is the possibility that the connector or a peripheral member is damaged and the workability may be deteriorated.

A majority of the memory card MC may be inserted into the connector 40. For example, only an end portion of the connection member may be coupled to the connector. The connector may be a USB connector, an optical connector, a coaxial connector, a connector for power, a connector for charging, or the like.

The distance between the edge of the mother board 30 and the edge of the opening 24 may be smaller than the distance between the connection opening 46 of the connector 40 and the edge of the opening 24. For example, the mother board 30 may be closer to the edge of the opening 24 than the connector 40. For example, the mother board 30 may be separated from the edge of the opening 24. The connection opening 46 of the connector 40 may project outward from the mother board 30. The connector 40 may be closer to the opening 24 than the mother board 30. For example, a gap may be formed.

The position at which the connector 40 is provided may be a position covered with another member as for the battery B. The connector may be provided so as to be exposed.

The direction in which the memory card MC is coupled to the connector 40 may be a direction parallel to the mother board 30 on which the connector 40 is mounted or may be a direction perpendicular to a printed board.

The electronic device may be a notebook computer. Alternatively, the electronic device may be a portable device such as a tablet computer, a mobile phone, a portable television, an electronic dictionary, a PDA, a game device, a camera, a music player, a navigation device, or a watch. The electronic device may be a stationary device such as a desktop computer, a monitor, a monitor having a computer built-in, a television, an audio, or another home electronic device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although an embodiment of the present invention has been described in detail, it should be understood that the various changes, substitutions, and alterations could be made hereto without departing from the spirit and scope of the invention.

What is claimed is:

1. An electronic device, comprising:
a housing including an opening;
a first connector, provided on a first surface of a printed board, configured to be exposed from the opening and to allow a connection member to be coupled to the connector;
a cable, provided on a side of a second surface of the printed board opposite to the first surface, configured to cover at least a portion of a gap between the connector and the opening and to be electrically coupled to the connector; and
a second connector located on the second surface of the printed board.

2. The electronic device according to claim 1, wherein the printed board is provided in the housing and is electrically coupled to the first connector and the cable.

3. The electronic device according to claim 1, wherein a distance from a connection portion provided on the printed board and coupled to the cable to the gap is shorter than a length of the connection member in a direction in which the connection member is coupled to the first connector.

4. The electronic device according to claim 3, wherein the cable projects from the connection portion in parallel to the printed board.

5. The electronic device according to claim 1, wherein the first connector includes a connection opening through which the connection member is connectable, and the gap is located on a near side of the connection opening in a direction in which the connection member is coupled to the first connector.

6. The electronic device according to claim 1, wherein the cable includes at least one of a single cable, a plurality of cables, a flat cable, and a flexible or flat cable.

7. The electronic device according to claim 1, wherein the cable extends from the second connector to a third connector provided in the housing and on an opposite side of the second connector across the gap.

8. An electronic device, comprising:
   a printed board having a first connector located on a first surface of the printed board for a connection member to be coupled to the printed board, and a second connector located on a second surface of the printed board opposite to the first surface;
   a cable connecting the second connector to an externally accessible cable group;
   a housing having an opening exposing the first connector on the printed board to allow coupling of the connection member to the first connector; and
   a gap between the opening of the housing and at least one of the printed board and the first connector, configured to be covered at least partially by the cable from a side of the second surface of the printed board.

9. The electronic device according to claim 8, wherein the cable projects from the second connector in parallel to the printed board.

10. The electronic device according to claim 8, wherein a distance from the second connector to the gap is shorter than a length of the first connector in a direction in which the connection member is coupled to the first connector.

11. The electronic device according to claim 8, wherein the first connector includes a connection opening through which the connection member is coupled, and the gap is located on a near side of the connection opening in a direction in which the connection member is coupled to the connector.

12. The electronic device according to claim 8, wherein the cable includes at least one of a single cable, a plurality of cables, a flat cable, and a flexible or flat cable.

* * * * *